United States Patent
Hwang et al.

(10) Patent No.: US 6,678,511 B2
(45) Date of Patent: Jan. 13, 2004

(54) CIRCUIT FOR CORRECTING PASS BAND FLATNESS

(75) Inventors: Hee Yong Hwang, Seoul (KR); Sang Won Yoon, Mokdong Apt. 223-401, Mok-dong, Yangcheon-ku, Seoul (KR)

(73) Assignees: Amotech Co., Ltd., Kyungki-do (KR); Sang Won Yoon, Seoul (KR)

( * ) Notice: Subject to any disclaimer, the term of this patent is extended or adjusted under 35 U.S.C. 154(b) by 500 days.

(21) Appl. No.: 09/781,434

(22) Filed: Feb. 13, 2001

(65) Prior Publication Data

US 2002/0052179 A1 May 2, 2002

(30) Foreign Application Priority Data

Oct. 28, 2000 (KR) ........................................ 2000-63801

(51) Int. Cl.[7] .................................................. H04B 1/26
(52) U.S. Cl. ....................................... 455/307; 455/339
(58) Field of Search ................................ 455/11.1, 339, 455/252.1, 333, 249.1, 338, 340, 341, 334, 295, 296, 307, 266; 333/167

(56) References Cited

U.S. PATENT DOCUMENTS

| | | | | |
|---|---|---|---|---|
| 5,983,070 A | * | 11/1999 | Georges et al. ............ 725/78 |
| 6,125,109 A | * | 9/2000 | Fuerter ....................... 370/315 |
| 6,292,652 B1 | * | 9/2001 | Kim ............................. 455/20 |
| 6,336,042 B1 | * | 1/2002 | Dawson et al. ........... 455/562.1 |
| 2001/0041548 A1 | * | 11/2001 | Bult et al. ................ 455/252.1 |
| 2002/0048326 A1 | * | 4/2002 | Sahlman ..................... 375/297 |
| 2002/0052179 A1 | * | 5/2002 | Hwang et al. ............. 455/11.1 |

* cited by examiner

*Primary Examiner*—Nay Maung
*Assistant Examiner*—Tan Trinh
(74) *Attorney, Agent, or Firm*—Rosenberg, Klein & Lee (57) ABSTRACT

A pass band flatness correction circuit for improving flatness of a ripple occurring within a pass band in a band pass filter and a mobile telecommunication repeater system is provided. The pass band flatness correction circuit includes a complementary band pass filter having a pass band transfer characteristic producing a counter-ripple of a reverse shape to a ripple in a pass band of a main band pass filter, for flattening a total of pass band transfer characteristics of a filtering system, an amplifier circuit for enhancing an increase in a filter insertion loss, and an attenuator circuit for enhancing a reflection loss characteristic of the whole circuit. The flatness and a stop band attenuation characteristic of the band pass filter whose pass band flatness is distorted and a repeater system employing the band pass filter is enhanced, to thereby improve performance and speech quality of a mobile telecommunication service.

10 Claims, 13 Drawing Sheets

FIG. 1

Prior Art

CIRCUIT FOR CORRECTING PASS BAND FLATNESS

BACKGROUND OF THE INVENTION

1. Field of the Invention

The present invention relates to a pass band flatness correction circuit for correcting a pass band flatness in a band pass filter and a repeater system, and more particularly, to a pass band flatness correction circuit for correcting the whole pass band flatness of the band pass filter and the repeater system in which a complementary band pass filter for producing a counter-ripple corresponding to a distorted pass band ripple of a main band pass filter is added in the main band pass filter.

2. Description of the Related Art

In general, in the case of a band pass filter (BPF), a loss characteristic in a pass band and an attenuation characteristic of stop band are determined by an unloaded quality factor (Qu) of a resonator constituting the filter. That is, a filter manufactured by using a resonator having a higher quality factor reveals a smaller loss value and a sharper attenuation characteristic, while a filter manufactured by using a resonator having a lower quality factor reveals that an insertion loss in a pass band increases and a stop band attenuation characteristic decreases.

Also, in the case of an ideal band pass filter designed using a Chebyshev or Butterworth function which is most widely used in designing a filter, a ripple in a pass band of the band pass filter should be constant irrespective of the number of stages of the filter. However, in the case that a band pass filter is implemented actually, as the number of stages in the filter, the stop band attenuation characteristic is enhanced by limitation of the quality factor depending upon the size of the resonator constituting the filter. However, the insertion loss in the pass band increases, and a center frequency and a flatness of the ripple is lowered at both ends of the pass band. As a result, the center portion in the pass band characteristic curve is convex.

That is, in the case that a filter is embodied using a dielectric such as ceramic and the other materials, performance of a resonator constituting a filter is limited according to properties of a dielectric material and an electrode material and size of the resonator, which causes an additional limitation of the filter loss characteristic and the pass band ripple characteristic. Further, a system having such a filter deteriorates flatness of the whole system to thereby cause lowering of the system performance.

In particular, in a repeater system, a band pass filter having an excellent stop band attenuation characteristic, that is, a multi-stage band pass filter should be employed in order to obtain an abrupt inter-band isolation characteristic. However, in the case of a band pass filter embodied using the conventional art, flatness of a ripple is lowered and then a power difference occurs between frequency channels, to accordingly lower quality of the whole repeater system.

Figure 1:
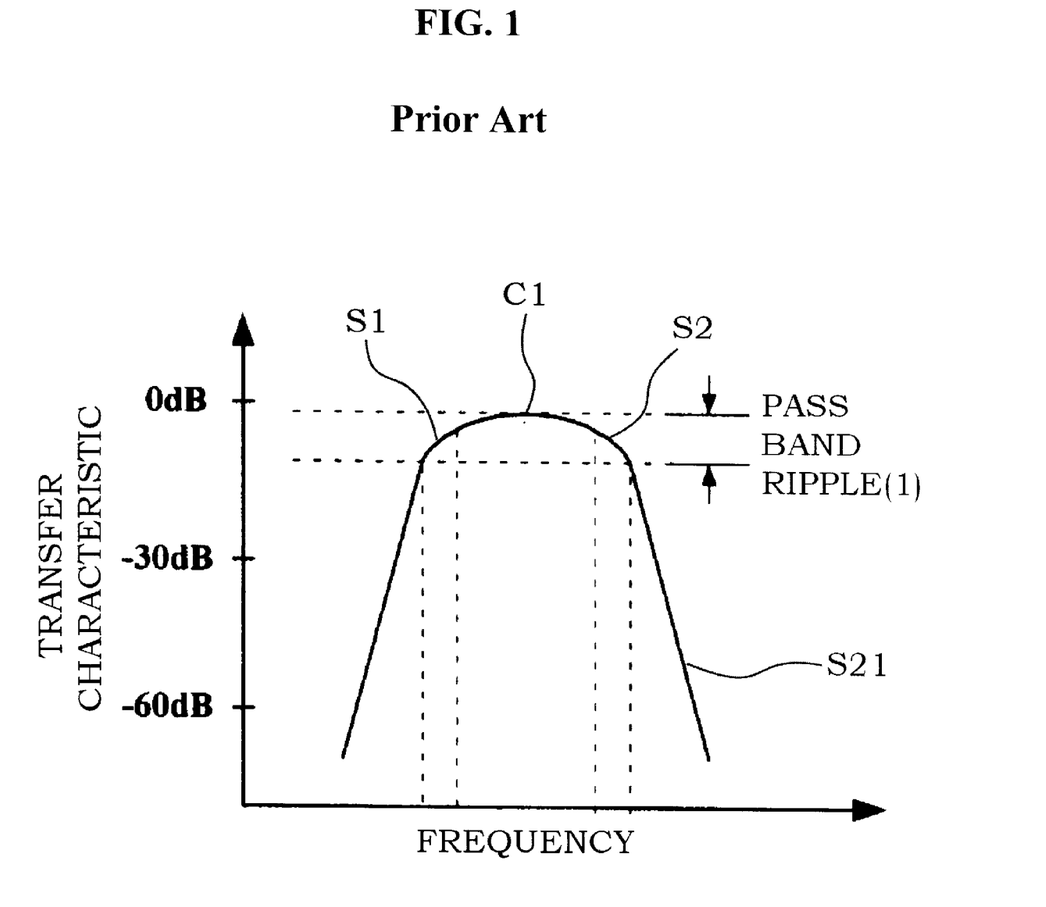
FIG. 1 is a graphical view showing frequency characteristics of a conventional band pass filter in which flatness of a ripple of a pass band by a limitation of a quality factor according to a size of a resonator constituting the band pass filter.

For example, a general band pass filter shown in FIG. 1 has a constant ripple 1 in a pass band and transmits a signal. According to the characteristic of the filter, the magnitude of a transfer signal at the center frequency in the pass band may differ from that at the end of the pass band. The difference in the magnitude of the transfer signal is determined by the quality factor of the resonator constituting the band pass filter.

A method for improving increasing the size of the resonator constituting the filter to thereby heighten the quality factor of the resonator and to then improve a ripple characteristic of the filter, is being used, in order to solve the above problems by using the conventional art, at the time when a band pass filter and a repeater system using the band pass filter are manufactured. However, in the case that a system of a limited size is embodied, the size of the resonator is also limited. Thus, the above method cannot be a fundamental enhancing method.

Thus, in the case that a band pass filter manufactured using a resonator having a limited quality factor of a determined size as in a dielectric is employed in a repeater system, it is necessary to correct a lowered flatness of a pass band ripple in which a filter a flatness correction circuit is required therein.

SUMMARY OF THE INVENTION

To solve the above problems, it is an object of the present invention to provide a pass band flatness correction circuit for correcting the whole pass band flatness of the band pass filter and the repeater system in which a complementary band pass filter for producing a counter-ripple corresponding to a distorted pass band ripple of a main band pass filter is added in the main band pass filter.

It is another object of the present invention to provide a pass band flatness correction circuit for enhancing flatness of the whole repeater system and simultaneously and additionally enhancing a stop band attenuation characteristic by an increase in the number of stages in a filter, in a mobile telecommunication repeater.

To accomplish the above object of the present invention, there is provided an active pass band flatness correction circuit for correcting a pass band flatness of a main band pass filter including a first ripple of a first shape in a pass band transfer characteristic, the active pass band flatness correction circuit comprising: a complementary band pass filter having a pass band transfer characteristic producing a counter-ripple of a reverse shape to the first ripple with respect to an input signal, for flattening the whole pass band transfer characteristic of the filter system; an amplifier circuit installed between the main band pass filter and the complementary band pass filter, for amplifying the input signal into a desired gain value; and a first attenuator circuit installed in the rear end of the complementary band pass filter, and having an attenuation characteristic with respect to the input signal in order to enhance a reflective loss characteristic.

The pass band flatness correction circuit further comprises a second attenuator circuit coupled to any one of front ends of the complementary band pass filter and the amplifier circuit, and the second attenuator circuit having an attenuation characteristic with respect to the input signal in order to improve a reflection loss characteristic.

According to another aspect of the present invention, there is also provided a passive pass band flatness correction circuit for correcting a pass band flatness of a main band pass filter including a first ripple of a first shape in a pass band transfer characteristic, the passive pass band flatness correction circuit comprising: a complementary band pass filter having a pass band transfer characteristic producing a counter-ripple of a reverse shape to the first ripple with respect to an input signal, for flattening the whole pass band transfer characteristic of the main band pass filter; and first and second attenuator circuits installed in the front and rear ends of the complementary band pass filter, and having an attenuation characteristic with respect to the input signal in order to enhance a reflective loss characteristic.

It is preferable that the main band pass filter includes the first ripple of a convex shape in the pass band transfer characteristic, and the complementary band pass filter includes the counter-ripple of a concave shape in the pass band transfer characteristic. It is preferable that the complementary band pass filter is comprised of 2n (n is an integer) resonators.

As described above, in the present invention, the complementary band pass filter producing a counter-ripple corresponding to a distorted pass band ripple in the main band pass filter or a repeater, is added in the main band pass filter or the repeater, and accordingly the counter-ripple of the flatness correction circuit is offset by the ripple of the main band pass filter or the repeater, to thereby correct the whole pass band flatness of the band pass filter or the system, and simultaneously and additionally improve an attenuation characteristic of a stop band.

BRIEF DESCRIPTION OF THE DRAWINGS

The above objects and other advantages of the present invention will become more apparent by describing the preferred embodiment thereof in more detail with reference to the accompanying drawings in which.

DETAILED DESCRIPTION OF THE INVENTION

A preferred embodiment of the present invention will be described with reference to the accompanying drawings.

Figure 2:
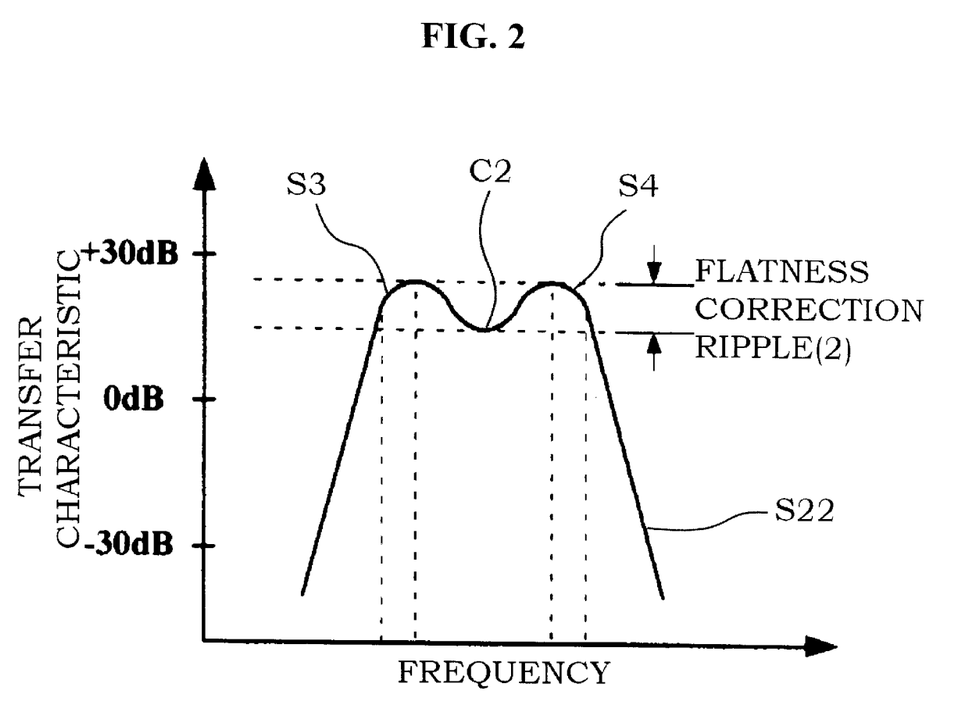
FIG. 2 is a graphical view showing frequency characteristics in a flatness correction circuit necessary for improving flatness of a ripple of a pass band in the characteristics of the band pass filter shown in FIG. 1.
Figure 3:
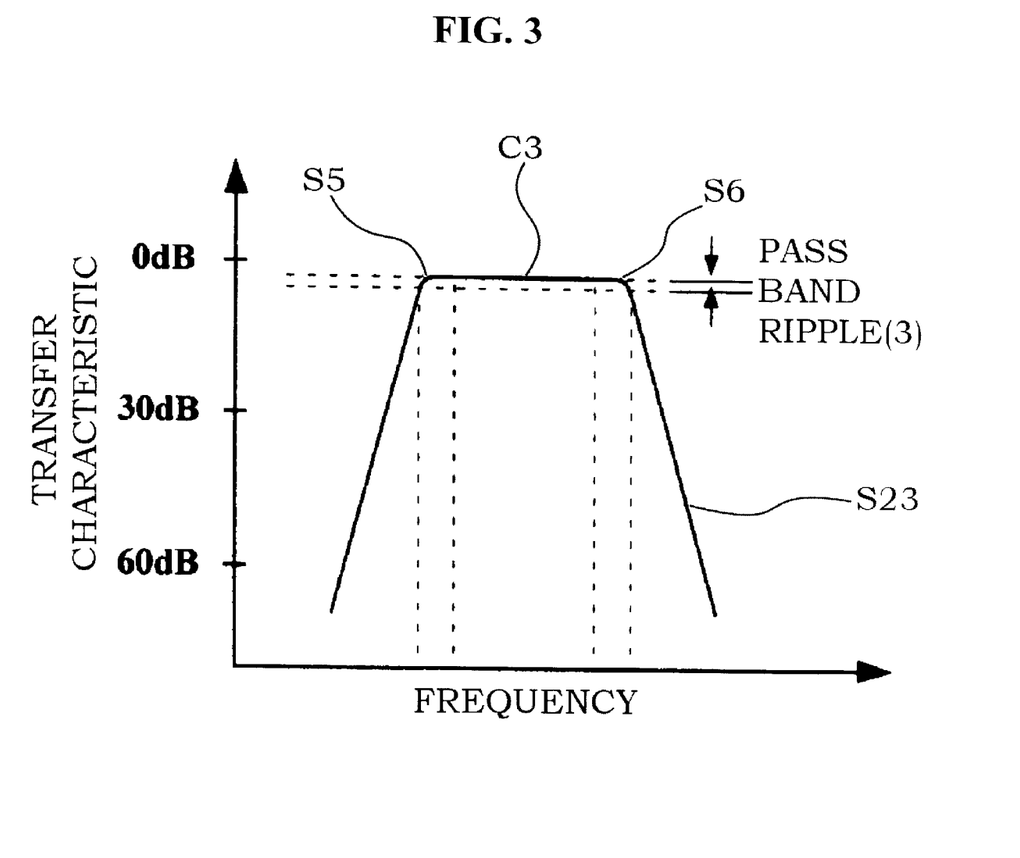
FIG. 3 is a graphical view showing frequency characteristics in which a flatness correction circuit is added in the band pass filter of FIG. 2 to thereby improve flatness of a ripple of a pass band shown in FIG. 1.

Referring to FIGS. 1 through 3, a flatness correction circuit according to the present invention will be described below.

Firstly, a transfer characteristic curve in a general band pass filter has a ripple characteristic 1 of a convex shape in which both ends S1 and S2 of the pass band sag in comparison with a center portion C1.

Thus, in order that the center portion C3 of the pass band transfer characteristic curve in the band pass filter and a ripple 3 between both ends S5 and S6 of the pass band have flatness as shown in FIG. 3, a flatness correction circuit is required which provides a transfer characteristic curve of FIG. 2 producing a counter-ripple 2 of a concave shape in which the center portion C2 of the pass band has a transfer characteristic value lower than both ends S3 and S4 of the pass band, as shown in FIG. 2, reversed to the ripple 1 of FIG. 1.

That is, if the flatness correction circuit having the characteristic of FIG. 2 is added to a general band pass filter having the characteristic of FIG. 1, the transfer characteristic having the flattened pass band ripple 3 of FIG. 3 can be realized.

A flatness correction circuit according to a preferred embodiment of the present invention will be described referring to FIG. 2.

Figure 4A:
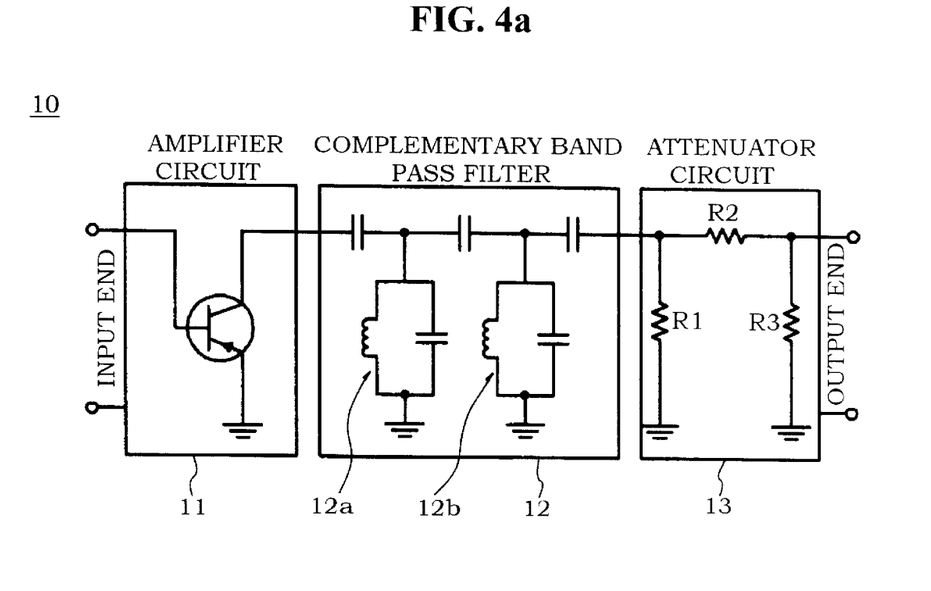
FIG. 4A is an active flatness correction circuit according to a first embodiment of the present invention.
Figure 7:
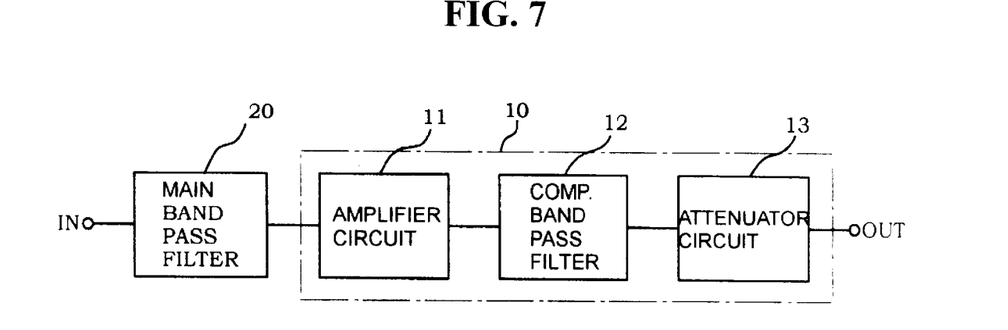
FIG. 7 is a schematic block diagram showing the whole module of a band pass filter system employing the first embodiment of the present invention.

FIG. 4A is an active flatness correction circuit 10 according to a first embodiment of the present invention, and FIG. 7 shows an example of a main band pass filter 20 coupled to an active flatness correction circuit 10 according to the first embodiment of the present invention.

The active flatness correction circuit 10 according to the first embodiment of the present invention includes an amplifier circuit 11 coupled to the main band pass filter revealing a distorted ripple characteristic, for improving an increase in the whole loss of an additional circuit, a complementary band pass filter 12 coupled to the amplifier circuit 11, for producing a ripple 2 having an inverse characteristic corresponding to the ripple 1 of the main band pass filter 20 in order to improve the flatness of the distorted ripple 1 in the main bandpass filter 20, and a first attenuator circuit 13 for improving a reflection loss characteristic of the complementary band pass filter 12.

Figure 8A:
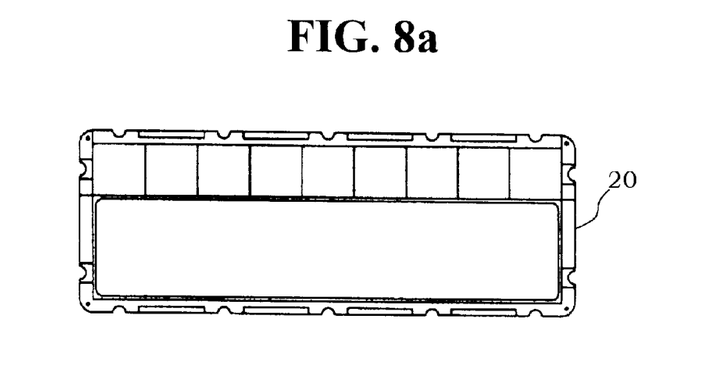
FIGS. 8A through 8C are a plan view, a rear view and a front view showing a main band pass filter using a nine-stage ceramic coaxial resonator, respectively.
Figure 8B:
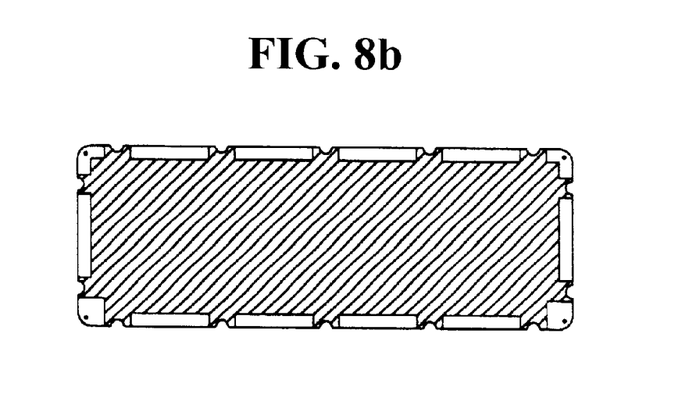
Figure 8C:
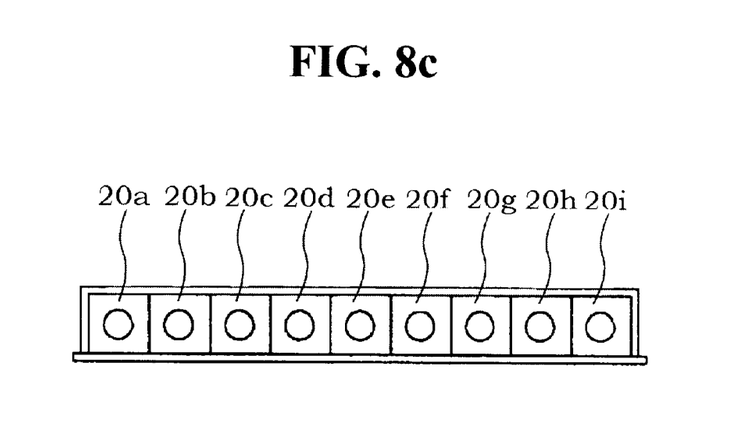
Figure 9:
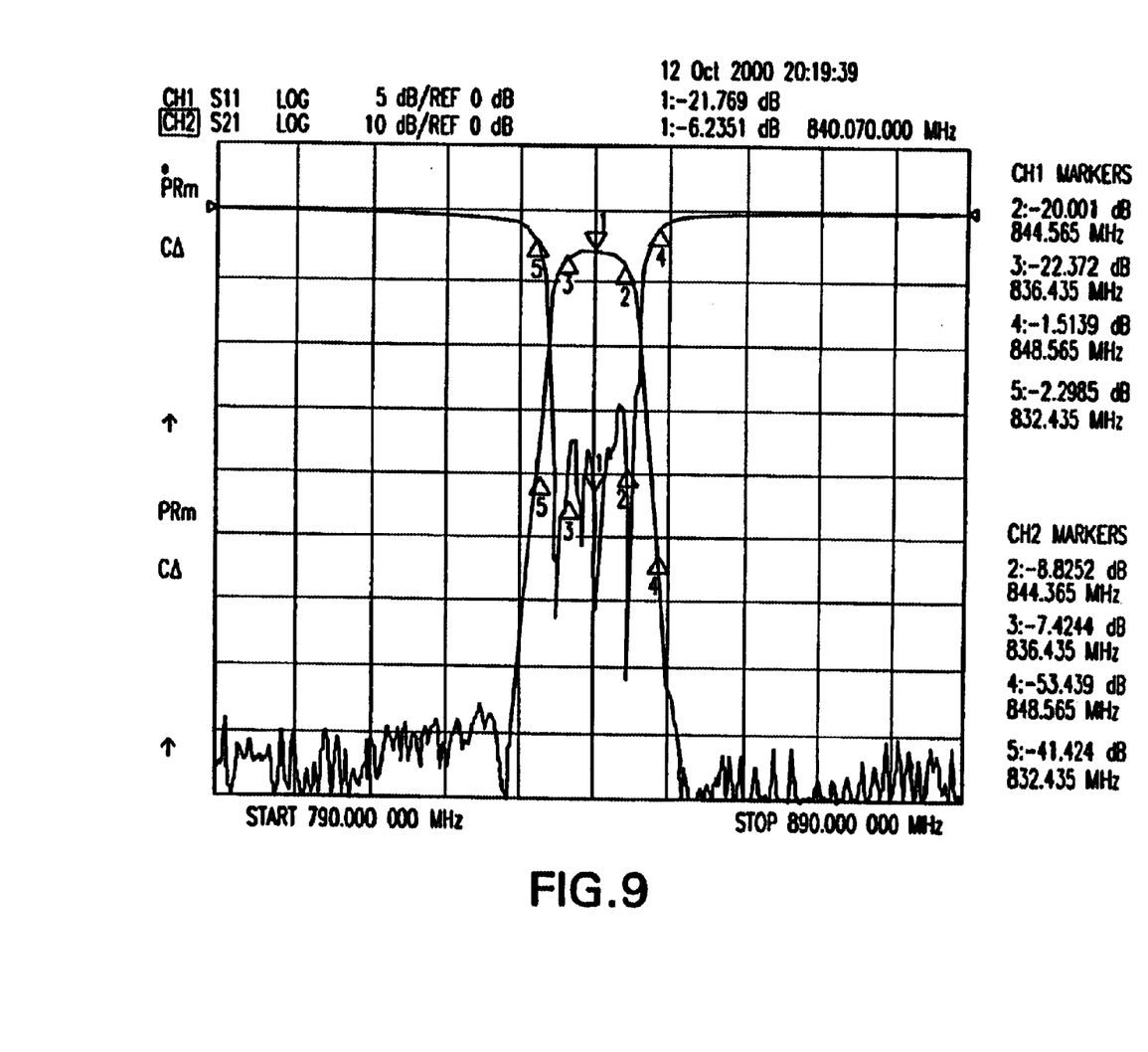
FIG. 9 is a graphical view showing frequency characteristics of the main band pass filter proposed in FIGS. 8A through 8C.

Here, the main band pass filter 20 can be configured as a nine-stage band pass filter, using ceramic coaxial resonators 20a–20i each having an unloaded quality factor of about 750 as shown in FIGS. 8A through 8C. As shown in FIG. 9, it can be seen that the band pass filter 20 has the transfer characteristic that the flatness of the pass band is lowered more than 3 dB at a bandwidth of about 12 MHz by limitation of the quality factor of the resonator.

Figure 5:
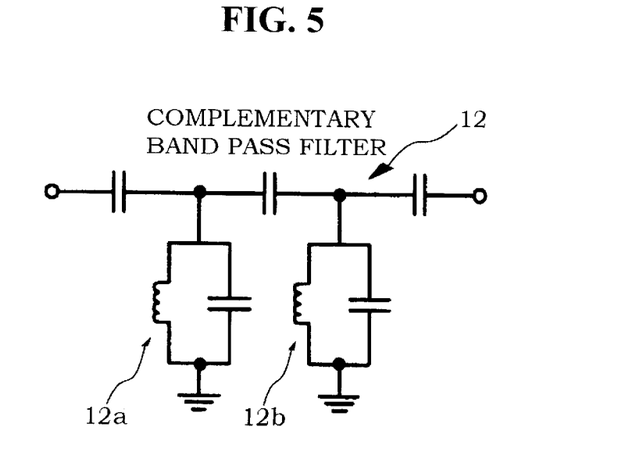
FIG. 5 is circuit diagram showing a complimentary two-stage band pass filter to be embodied in first through third embodiments according to the present invention.

The complementary band pass filter 12 can be embodied so that the number of stages is increased or decreased according to the performance of the main band pass filter 20 or the repeater system whose flatness of the ripple in the pass band is desired to be enhanced as shown in FIG. 5, and is fabricated to have the transfer characteristic of a counter-ripple 2 whose magnitude value is approximate to that of the pass band ripple 1 of the band pass filter 20.

The complementary band pass filter 12 can be implemented by a filter designed in any number of stages, preferably, in the even number of stages such as two or four stages so as to have the counter-ripple 2, using ceramic coaxial resonators or other dielectric materials.

Thus, in the case that the complementary band pass filter 12 is added in the main band pass filter 20, the counter-ripple 2 is offset with the ripple 1 of the band pass filter 20. As a result, the transfer characteristic of the whole filter system has the flattened pass band ripple 3. Also, the added complementary band pass filter 12 provides an increase in the number of stages in the additional filter, to thereby provide an additional effect of improving a stop band attenuation characteristic.

The amplifier circuit 11 included in the flatness correction circuit 10 improves an increase in an insertion loss value within the pass band according to the addition of the complementary band pass filter 12. In this case, the gain value of the amplifier can be adjusted to have any one gain value according to a device selection, the loss characteristic of the band pass filter 20 and a system characteristic in the design of the amplifier, and can be implemented so that the whole characteristic of the flatness correction circuit has a negative or positive gain value.

The first attenuator circuit 13 corrects lowering of the reflection loss characteristic due to the addition of the complementary band pass filter 12. The characteristic of the first attenuator circuit 13 can be designed and fabricated to have any one attenuation ratio according to the characteristics of the complementary band pass filter 12 and the amplifier circuit 11. Also, it is possible to fabricate the first attenuator circuit 13 in the form of a resistor or any concentrative device, or a distributive device using a dielectric substrate.

Figure 6A:
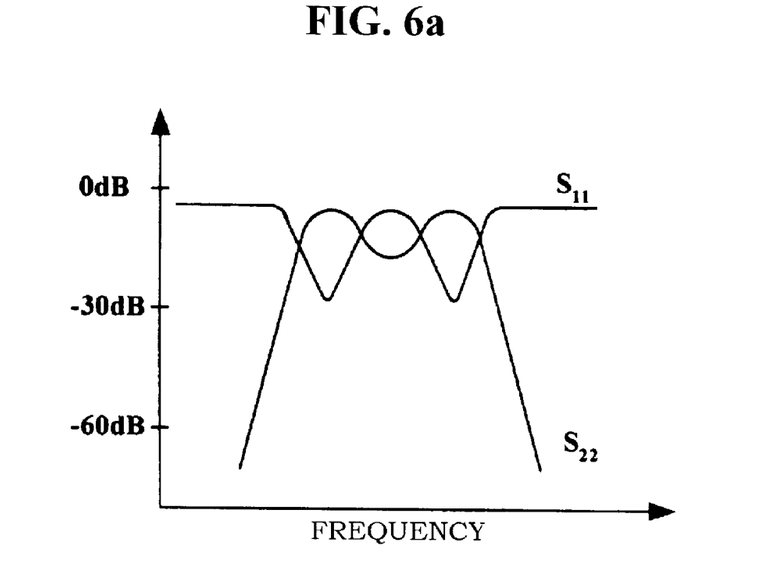
FIG. 6A is a graphical view showing frequency characteristics in a flatness correction circuit embodied according to the first embodiment.

The frequency characteristic of the active flatness correction circuit according to the first embodiment of the present invention has a counter-ripple characteristic corresponding to the complementary band pass filter 12 as shown in FIG. 6A. It is possible to realize the ripple value and the gain characteristic of the correction circuit 10, in various forms, using the gains of the complementary band pass filter 12 and the amplifier circuit 11 and the attenuation characteristic of the first attenuator circuit 13.

Figure 10:
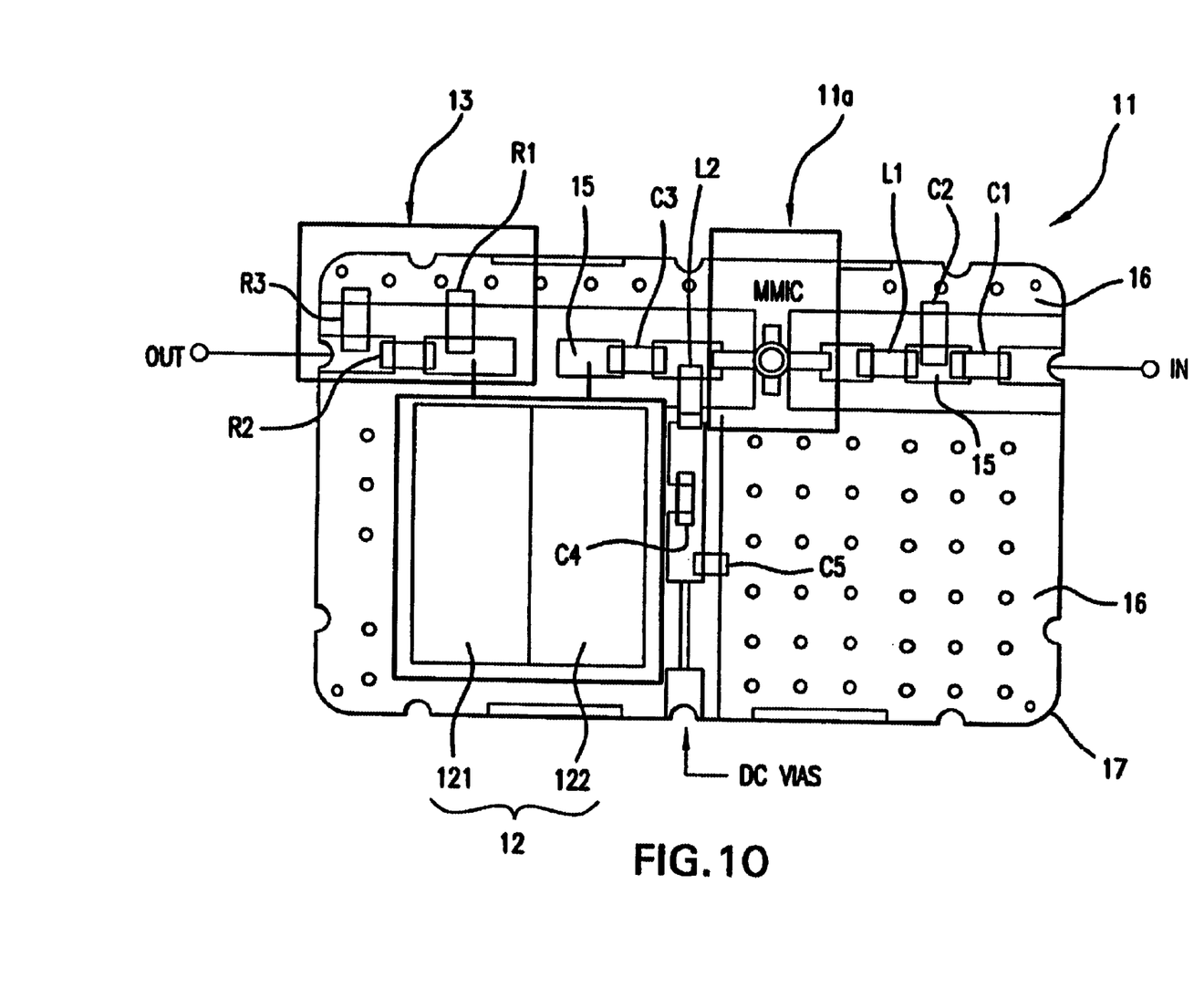
FIG. 10 shows a layout of the flatness correction circuit embodied according to the first embodiment of the present invention.

In order to ascertain the characteristic of the first embodiment of the present invention, the flatness correction circuit 10 can be fabricated as shown in FIG. 10. The complementary band pass filter 12 shown in FIG. 10 uses two 6 mm×6 mm coaxial resonators 121 and 122 each having a dielectric constant of 38 and an unloaded quality factor of about 570, and thus is implemented to have a double-humped characteristic by forming first and second resonator circuits 12a and 12b (referring to FIGS. 4A and 5) each performing a parallel resonance at a desired frequency.

Also, the flatness correction circuit 10 is implemented by a one-stage amplifier circuit 11 using a monolithic microwave integrated circuit (MMIC) 11 having a gain of about 13 dB at its input end, and an attenuator circuit 13 whose attenuation characteristic is −10 dB using three chip resistors R1–R3, a conductive pattern 15 and a ground pattern 16 at its output end. Accordingly, the flatness correction filter circuit has been implemented on a printed circuit board (PCB) 17. Also, a matching circuit including chip capacitors C1–C5 and chip inductors L1 and L2 is coupled between the conductive pattern 15 and the ground pattern 16 at the input and output ends of the MMIC 11a.

Figure 11:
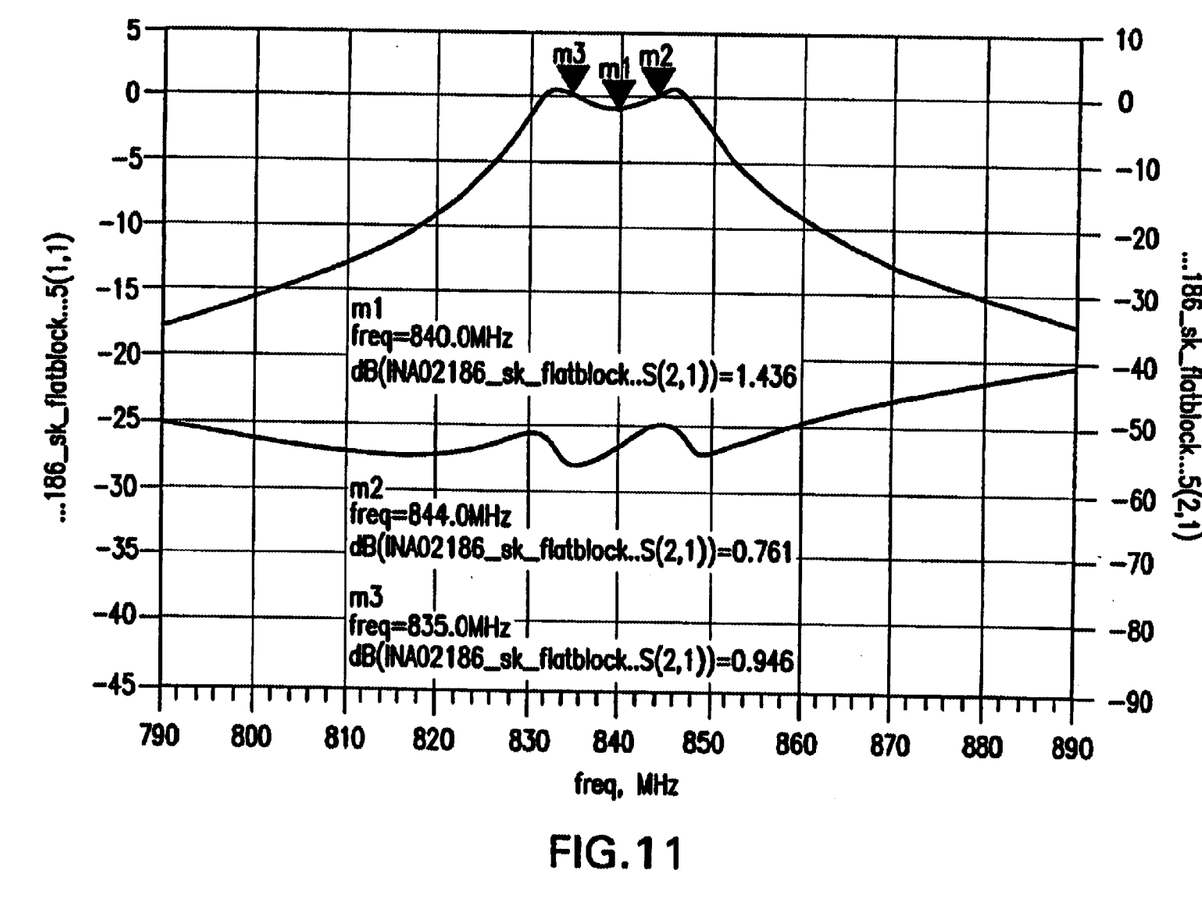
FIG. 11 shows simulation frequency characteristics of the flatness correction circuit embodied according to the first embodiment of the present invention.

FIG. 11 is a graphical view showing a simulative result of the frequency characteristics of the flatness correction circuit 10 shown in FIG. 10, which shows a pass band ripple value of about 2.5 dB and a reflection loss value of 20 dB or so.

Figure 12:
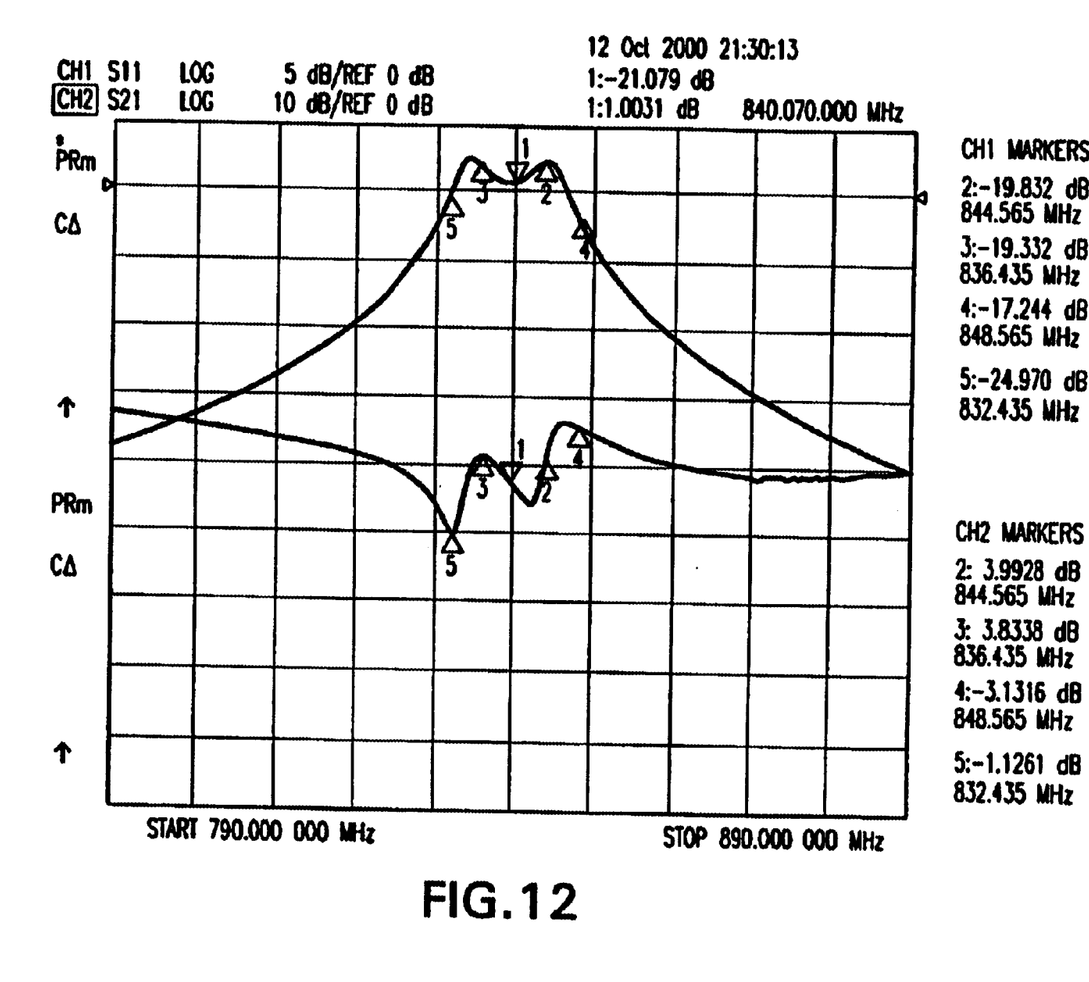
FIG. 12 is a graphical view showing the measured frequency characteristics according to the first embodiment of the present invention shown in FIG. 10.

FIG. 12 is a graphical view showing the measured frequency characteristics of the flatness correction circuit 10 shown in FIG. 10, in which it can be seen that an insertion loss of 0 dB in the pass band, a reflection loss of 20 dB or less and a pass band ripple value of 2.5 dB can be obtained. This shows that measured frequency characteristics match well the simulative results shown in FIG. 11.

Figure 13:
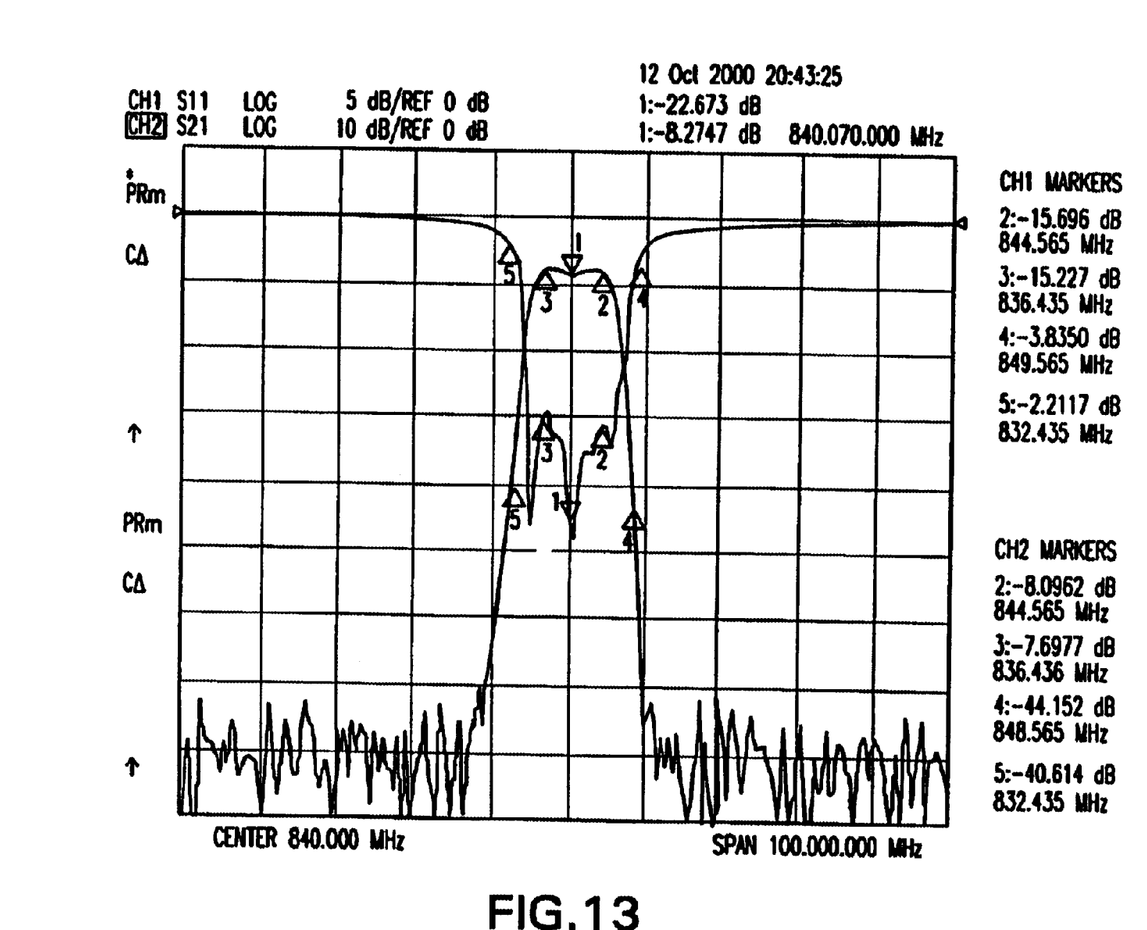
FIG. 13 is a graphical view showing the measured frequency characteristics in a band pass filter system in which the flatness correction circuit according to the first embodiment of the present invention is added in the main band pass filter of FIG. 8.

FIG. 13 is a graphical view showing the improved flatness characteristics in a band pass filter system in which the flatness correction circuit 10 of FIG. 10 fabricated according to the first embodiment of the present invention is added in the nine-stage main band pass filter 20 having a coaxial resonator type of FIG. 8, which is configured by the circuit shown in FIG. 7.

It can be seen that the ripple value in the pass band has a flat value within 1 dB from the frequency characteristic of the band pass filter system shown in FIG. 13. It can be also seen that the stop band attenuation characteristic is improved in comparison to the characteristic of the main band pass filter 20 shown in FIG. 9.

Figure 4B:
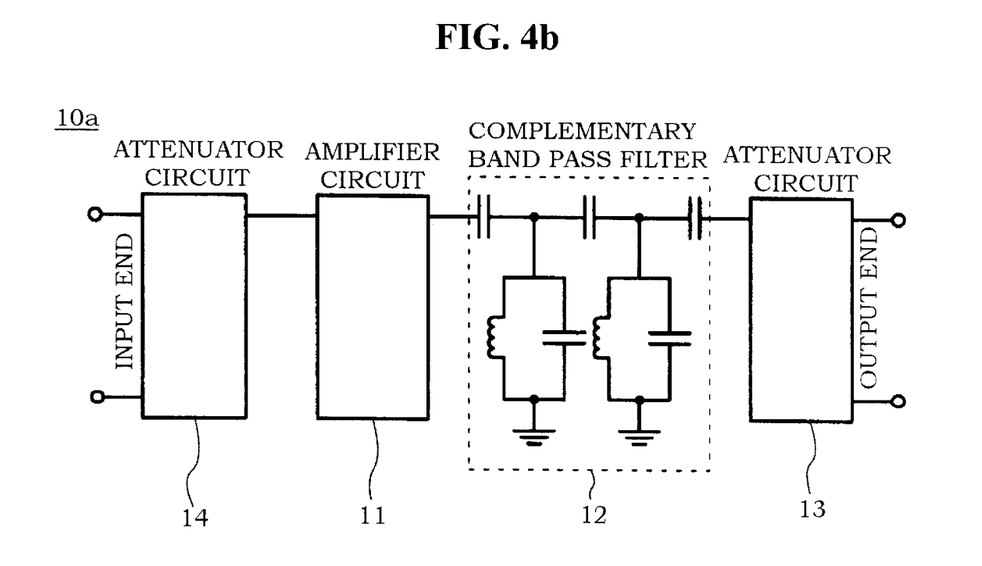
FIG. 4B is an active flatness correction circuit according to a second embodiment of the present invention, in which a reflection loss characteristic is improved in the whole circuit of the first embodiment.

An active flatness correction circuit 10a according to a second embodiment of the present invention shown in FIG. 4B, is implemented by adding a second attenuator circuit 14 at the input end of the amplifier circuit 11 of the first embodiment, to thereby further improve a reflection loss characteristic in the whole correction circuit.

Figure 6B:
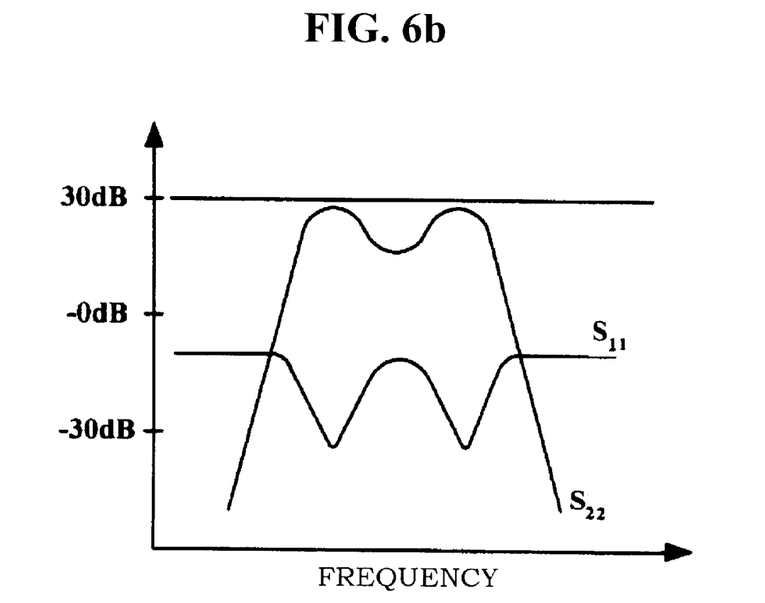
FIG. 6B is a graphical view showing frequency characteristics in a flatness correction circuit embodied according to the second embodiment.

The frequency characteristic of the active flatness correction circuit 10b according to the second embodiment is shown in FIG. 6B. The ripple value and the gain characteristic of the correction circuit 10a can be realized in various forms, using the gains of complementary band pass filter 12 and the amplifier circuit 11 and the attenuation characteristic of the attenuator circuit 13. Here, since the second attenuator circuit 14 has been added, the reflection loss characteristic of the whole circuit is more excellent than that of the first embodiment.

Figure 4C:
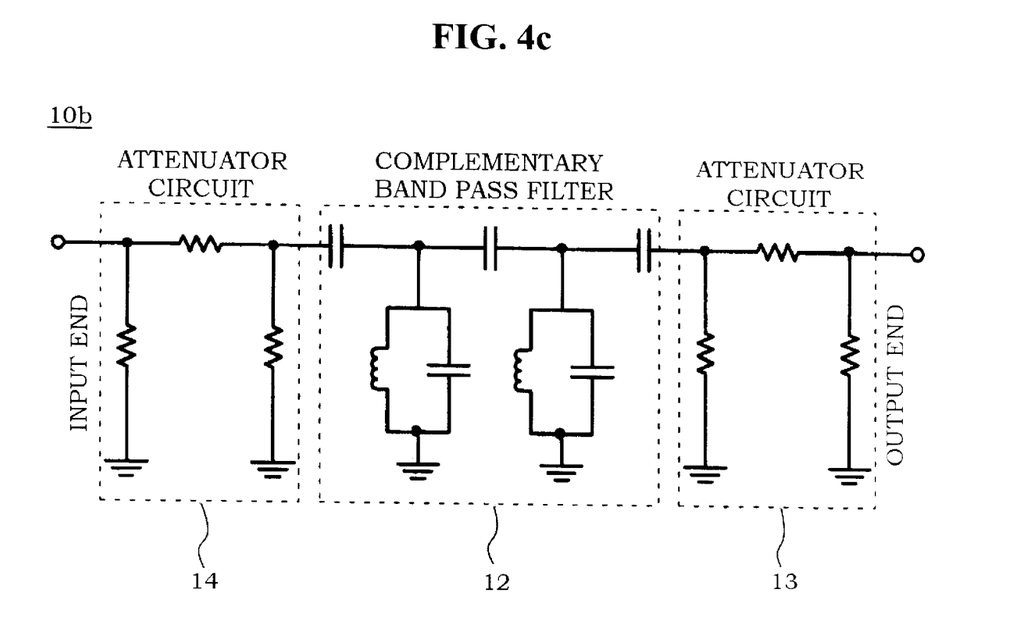
FIG. 4C is a passive flatness correction circuit according to a third embodiment of the present invention.

FIG. 4C is a passive flatness correction circuit 10b according to a third embodiment of the present invention, which includes a complementary band pass filter 12 and two attenuator circuits 13 and 14 being first and second attenuator circuits.

Figure 6C:
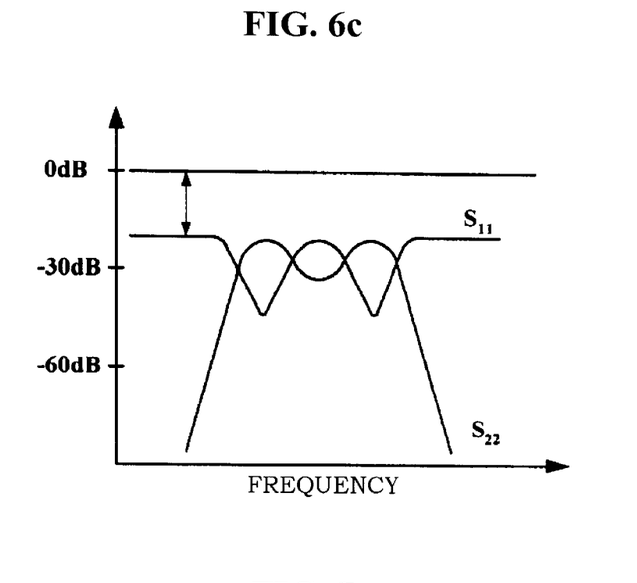
FIG. 6C is a graphical view showing frequency characteristics in a flatness correction circuit embodied according to the third embodiment.

The passive flatness correction circuit 10b embodied in the third embodiment of the present invention reveals the frequency characteristic as shown in FIG. 6C. The characteristic of the whole correction circuit 10b has a negative gain value by the first and second attenuator circuits 13 and 14 of two. The gain is determined by the attenuation ratio of the attenuator circuits 13 and 14.

Meanwhile, since the characteristics of the second and third embodiments respectively shown in FIGS. 4B and 4C are similar to that of the first embodiment, the detailed description thereof will be omitted.

The present invention has been described with reference to the above embodiments. However, it is apparent that many modifications and variations can be accomplished by a person skilled in the art. For example, the complementary band pass filter 12 can be implemented by a multi-stage filter other than the two-stage filter, in implementing the flatness correction circuit. Also, the complementary band pass filter 12 can be implemented using various sizes of ceramic substrates or various dielectric materials other than the ceramic coaxial resonator.

In addition, in the above embodiments, the flatness correction circuits have been proposed with respect to the case that the transfer characteristic curve of the band pass filter has a convex shape. However, the present invention is not limited thereto, but can configure a flatness correction circuit having a ripple of a counter-shape in the case of a different shape of a transfer characteristic as well.

Further, in the above embodiments, the present invention has been described with respect to the cases that the band pass filter has a transfer characteristic curve of a convex shape. However, the present invention is not limited thereto, but can be applied to other repeater systems or telecommunication system having the same transfer characteristics as those of the above embodiments.

Further, the number of the stages and the gain value in the amplifier circuit 11 can be adjusted as desired, and the attenuation ratio of the attenuator circuit 13 can be also adjusted which can be implemented in various forms other than a chip resistor.

Furthermore, according to modification of the first embodiment, the pass band flatness correction circuit further includes an additional attenuator circuit coupled between the complementary band pass filter and the amplifier circuit, the additional attenuator circuit having an attenuation characteristic with respect to the input signal in order to improve a reflection loss characteristic.

As described above, the present invention provides the active and passive pass band flatness correction circuits each having the complementary band pass filter, the amplifier circuit and the attenuator circuit, in order to produce a counter-ripple to improve the ripple of the flatness reduced band pass filter.

The flatness correction circuit according to the present invention can improve the flatness of the pass band ripple of the general band pass filter and obtain an additional effect of improving the attenuation characteristic. Also, a system such as a mobile telecommunication repeater employing a pass band flatness correction circuit in which the flatness has been improved, makes equal the power difference between the frequency channels to thereby improve the performance of the whole system, and contribute to improvement of a speech quality for a mobile telecommunication service.

As described above, the present invention has been described with respect to the particularly preferred embodiments thereof. However, the present invention is not limited to the above embodiments, but various modifications and corrections can be possible by one who has an ordinary skill in the art without departing off the spirit of the present invention and within the technical scope of the appended claims.

What is claimed is:

1. A pass band flatness correction circuit for correcting a pass band flatness of a main band pass filter including a first ripple of a first shape in a pass band transfer characteristic for use in a band pass filter system, the pass band flatness correction circuit comprising:
    a complementary band pass filter having a pass band transfer characteristic producing a counter-ripple of a reverse shape to the first ripple with respect to an input signal, for flattening the whole pass band transfer characteristic of the band pass filter system;
    an amplifier circuit installed between the main band pass filter and the complementary band pass filter, for amplifying the input signal into a desired gain value; and
    a first attenuator circuit installed in the rear end of the complementary band pass filter, and having an attenuation characteristic with respect to the input signal in order to enhance a reflective loss characteristic.

2. The pass band flatness correction circuit of claim 1, further comprising a second attenuator circuit coupled to any one of front ends of the complementary band pass filter and the amplifier circuit, and said second attenuator circuit having an attenuation characteristic with respect to the input signal in order to improve a reflection loss characteristic.

3. The pass band flatness correction circuit of claim 1, wherein said main band pass filter includes the first ripple of a convex shape in the pass band transfer characteristic, and said complementary band pass filter includes the counter-ripple of a concave shape in the pass band transfer characteristic.

4. The pass band flatness correction circuit of claim 3, wherein said complementary band pass filter is configured by resonators of 2n in which n is a positive number.

5. A pass band flatness correction circuit for correcting a pass band flatness of a main band pass filter including a first ripple of a first shape in a pass band transfer characteristic, the passive pass band flatness correction circuit comprising:
    a complementary band pass filter having a pass band transfer characteristic producing a counter-ripple of a reverse shape to the first ripple with respect to an input signal, for flattening the whole pass band transfer characteristic of the main band pass filter; and
    first and second attenuator circuits installed in the front and rear ends of the complementary band pass filter, and having an attenuation characteristic with respect to the input signal in order to enhance a reflective loss characteristic.

6. The pass band flatness correction circuit of of claim 5, wherein said main band pass filter includes the first ripple of a convex shape in the pass band transfer characteristic, and said complementary band pass filter includes the counter-ripple of a concave shape in the pass band transfer characteristic.

7. A pass band flatness correction circuit for correcting a pass band flatness of a telecommunication system including a first ripple of a first shape in a pass band transfer characteristic, the pass band flatness correction circuit comprising:
    a complementary band pass filter having a pass band transfer characteristic producing a counter-ripple of a reverse shape to the first ripple with respect to an input signal, for flattening the whole pass band transfer characteristic of the telecommunication system;
    an amplifier circuit installed between the telecommunication system and the complementary band pass filter, for amplifying the input signal into a desired gain value; and
    a first attenuator circuit installed in the rear end of the complementary band pass filter, and having an attenuation characteristic with respect to the input signal in order to enhance a reflective loss characteristic.

8. The pass band flatness correction circuit of claim 7, wherein said main band pass filter includes the first ripple of the convex shape in the pass band transfer characteristic, and said complementary band pass filter includes the counter-ripple of a concave shape in the pass band transfer characteristic.

9. The pass band flatness correction circuit of claim 8, wherein said complementary band pass filter is configured by resonators of 2n in which n is a positive number.

10. A telecommunication system having a function of correcting flatness of the system comprising;
- a communication apparatus including a first ripple of a first shape in a pass band transfer characteristic with respect to an input signal, for executing communications;
- an amplifier circuit installed in the rear end of the communication apparatus, for amplifying the input signal into a desired gain value;
- a complementary band pass filter installed in the rear end of the amplifier circuit, and having a pass band transfer characteristic producing a counter-ripple of a reverse shape to the first ripple with respect to the input signal, for flattening the whole pass band transfer characteristic of the telecommunication system; and
- a first attenuator circuit installed in the rear end of the complementary band pass filter, and having an attenuation characteristic with respect to the input signal in order to enhance a reflective loss characteristic.

* * * * *